(12) United States Patent
Wang

(10) Patent No.: US 7,854,630 B1
(45) Date of Patent: Dec. 21, 2010

(54) MODULE CONNECTOR

(75) Inventor: Chin-Chou Wang, Tu-Cheng (TW)

(73) Assignee: Cheng Uei Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 12/634,685

(22) Filed: Dec. 9, 2009

(51) Int. Cl.
  *H01R 13/648* (2006.01)
(52) U.S. Cl. .............................. 439/607.27
(58) Field of Classification Search ............ 439/607.27, 439/330, 331
See application file for complete search history.

(56) References Cited

U.S. PATENT DOCUMENTS

| 7,077,664 | B1 * | 7/2006 | Wang et al. | 439/70 |
| 7,077,680 | B1 * | 7/2006 | Wang et al. | 439/331 |
| 7,156,679 | B1 * | 1/2007 | Wang et al. | 439/330 |
| 7,261,599 | B2 * | 8/2007 | Li | 439/607.01 |
| 7,288,003 | B2 * | 10/2007 | Ono et al. | 439/607.01 |
| 7,717,730 | B2 * | 5/2010 | Wu | 439/331 |
| 2006/0063399 | A1 * | 3/2006 | Li | 439/70 |
| 2008/0119080 | A1 * | 5/2008 | Wu | 439/331 |

* cited by examiner

*Primary Examiner*—T C Patel
*Assistant Examiner*—Vladimir Imas
(74) *Attorney, Agent, or Firm*—Cheng-Ju Chiang

(57) ABSTRACT

A module connector has a socket and a second shield covered to the socket. The socket has an insulating housing having a rectangular base and four sidewalls extended upwards from four edges of the base, forming a receiving chamber for receiving a lens module, and a first shield coupled with the insulating housing and having four lateral plates. At least one lateral plate has a plurality of locking openings. The second shield has a rectangular frame and four containing plates extended downwards from outer edges of the frame. At least one containing plate has two parallel slits extending upwards and downwards and passing through a bottom edge thereof, forming a free slice therebetween. A plurality of protrusions is disposed at an inner surface of the free slice, corresponding to the locking openings.

5 Claims, 4 Drawing Sheets

MODULE CONNECTOR

BACKGROUND OF THE INVENTION

1. Field of the Invention

The present invention relates to a module connector, and particularly to a module connector for receiving a lens module.

2. The Related Art

With the digital camera technology developing, more and more consumption electronic products are equipped with the photographing function. It is familiar that a module connector is set on a body of the consumption electronic product for fixing a lens module to integrate the photographing function. U.S. Pat. No. 7,077,664 describes a module connector which includes an insulated component, a plurality of contacts inside the module connector and a housing shell outside of the module connector. The insulated component has four sidewalls that define an inserting space to receive an outside module. Each sidewall has a plurality of parallel L-shaped slots to accommodate the contacts that are electrically connected with the outside module. The housing shell has four side containing walls. A pressing pin and an elastic pin are extended from the top of each side containing wall towards the inserting space. The pressing pins prop downwardly the outside module. However, as the outside module is manufactured to show a rectangular block shape, with a top surface beyond the tops of the four side-containing walls, it is impossible to use the pressing pins to fix the outside module in the module connector.

SUMMARY OF THE INVENTION

Accordingly, an object of the present invention is to provide a module connector for receiving a lens module. The module connector has a socket and a second shield covered to the socket. The socket has an insulating housing having a rectangular base and four sidewalls extended upwards from four edges of the base, forming a receiving chamber for receiving the lens module, and a first shield coupled with the insulating housing and having four lateral plates. The lateral plates are connected with one another and enclose outer peripheries of the sidewalls. At least one lateral plate has a plurality of locking openings. The second shield has a rectangular frame and four containing plates extended downwards from outer edges of the frame. At least one containing plate has two parallel slits extending upwards and downwards and passing through a bottom edge thereof, forming a free slice therebetween. A plurality of protrusions is disposed at an inner surface of the free slice, corresponding to the locking openings. The frame covers a top of the lens module received in the receiving chamber. The free slice deflects outwards resiliently when the protrusions slide on the lateral plate and returns automatically until the protrusions slide into the locking openings, for fixing the second shield to the socket.

As described above, the module connector provides the simple second shield for fixing the lens module in the socket. The free slice separated from the containing plate by the two slits, can deflects outwards resiliently with respect to the containing plate in assembling process, consequently, the protrusions slide into the locking openings smoothly, without scraping against the lateral plate and deforming the lateral plate. Therefore, the structure of the second shield is capable of fixing the lens module in the socket, meanwhile, facilitates the assembly and guarantees the quality of the module connector.

BRIEF DESCRIPTION OF THE DRAWINGS

The present invention will be apparent to those skilled in the art by reading the following description thereof, with reference to the attached drawings, in which.

DETAILED DESCRIPTION OF THE EMBODIMENT

Figure 1:
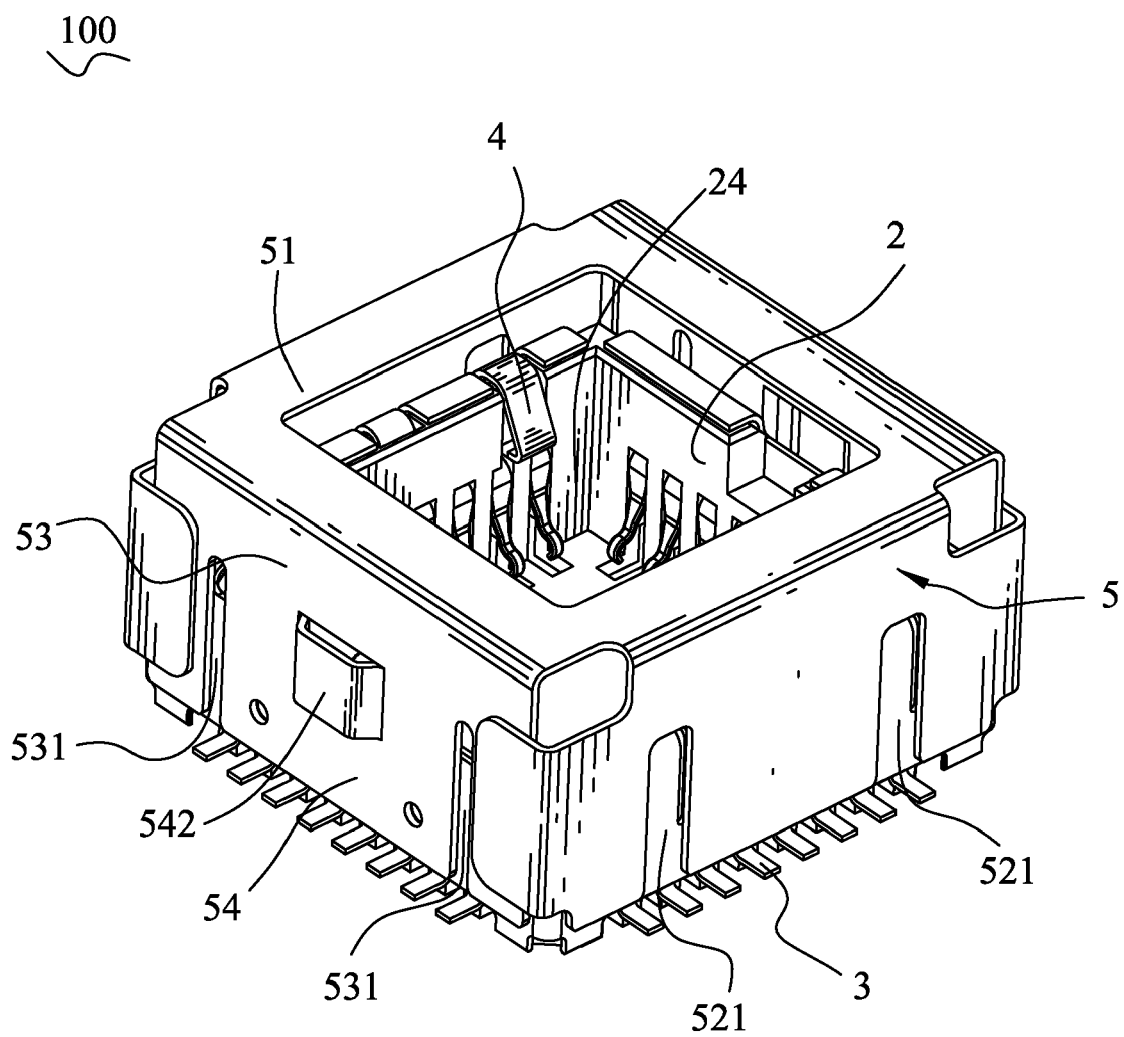
FIG. 1 is an assembled, perspective view of a module connector of an embodiment in accordance with the present invention.
Figure 2:
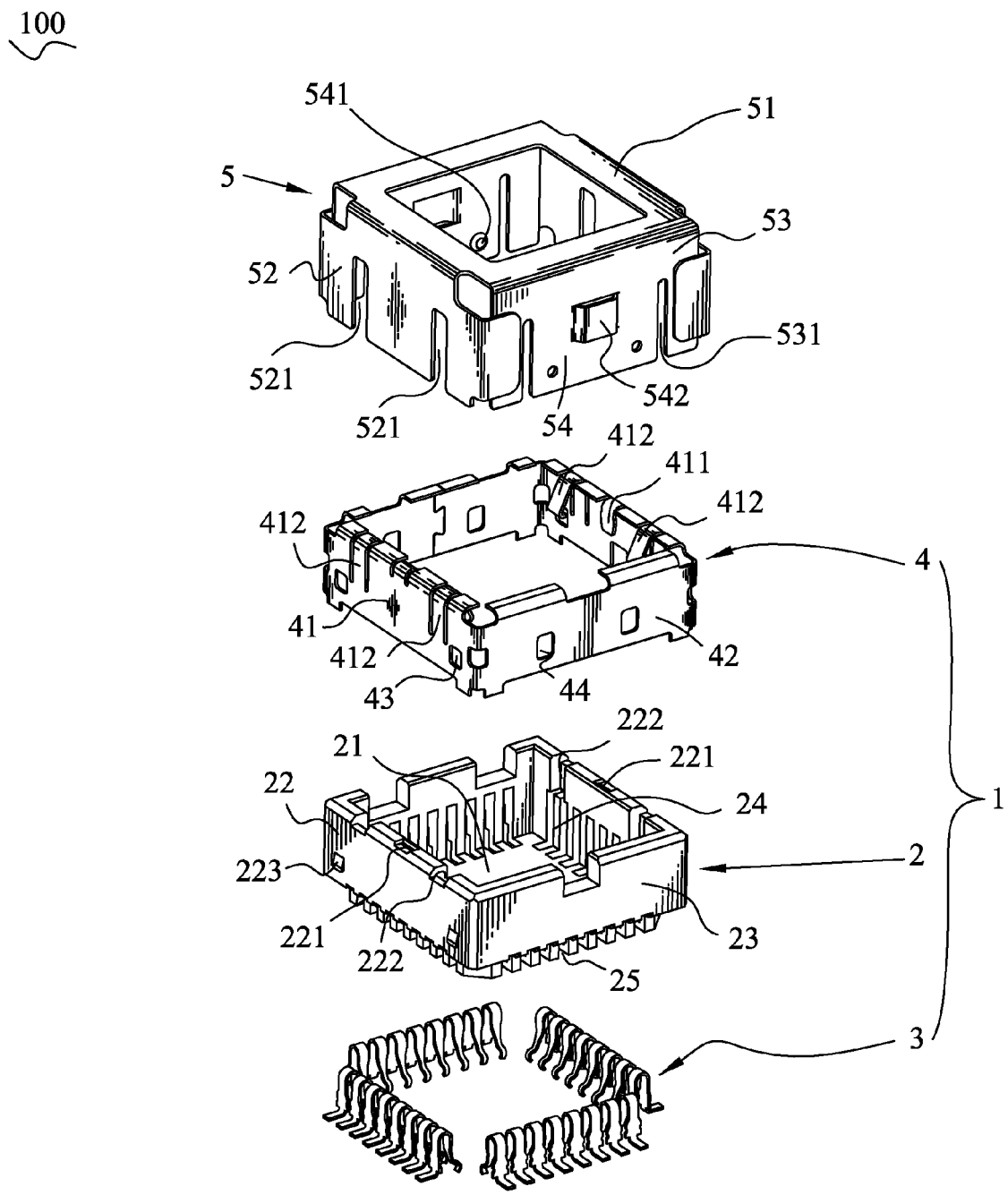
FIG. 2 is an exploded, perspective view of the module connector shown in FIG. 1.

Referring to the drawings in greater detail, and first to FIGS. 1-2, the embodiment of the invention is embodied in a module connector 100. The module connector 100 comprises an insulating housing 2, a plurality of contacts 3 mounted in the insulating housing 2, a first shield 4 coupled with the insulating housing 2, and a second shield 5. The insulating housing 2, the contacts 3 and the first shield 4 are assembled together to form a socket 1 for receiving a lens module 200 (shown in FIG. 4).

Please refer to FIG. 2, the insulating housing 2 has a rectangular base 21. Four edges of the base 21 extend perpendicularly and upwardly to form two opposite first sidewalls 22 and two opposite second sidewalls 23 connected with the first sidewalls 22, forming a receiving chamber 24 for receiving the lens module 200. Each of the first sidewalls 22 has a buckling trough 221 at a middle portion of a top surface thereof, and two holding recesses 222 disposed symmetrically about the buckling trough 221. The holding recess 222 of substantially inverted-L shape is disposed at an upper portion of the first sidewall 22, penetrating an inner surface and the top surface of the first sidewall 22. The inner surface of each first sidewall 22 has a plurality of contact grooves 25 at a lower portion thereof. The contact grooves 25 extend upwards and downwards and pass through the base 21 for receiving the contacts 3. A plurality of fixing lumps 223 is protruded outwards from an outer surface of each first sidewall 22.

The first shield 4 has two opposite first lateral plates 41 and two opposite second lateral plates 42 respectively wrapping the first sidewalls 22 and the second sidewalls 23 of the insulting housing 2. A top edge of each first lateral plate 41 is bent inwards to form a buckling slice 411 at a middle portion thereof, corresponding to the buckling trough 221, and two holding slices 412 disposed at two sides of the buckling slice 411, corresponding to the holding recesses 222. The first lateral plate 41 further has a plurality of fixing openings 43 for mating with the fixing lumps 223. Each of the second lateral plates 42 has a plurality of locking openings 44. In this embodiment, there are two locking openings arranged side by side.

Figure 3:
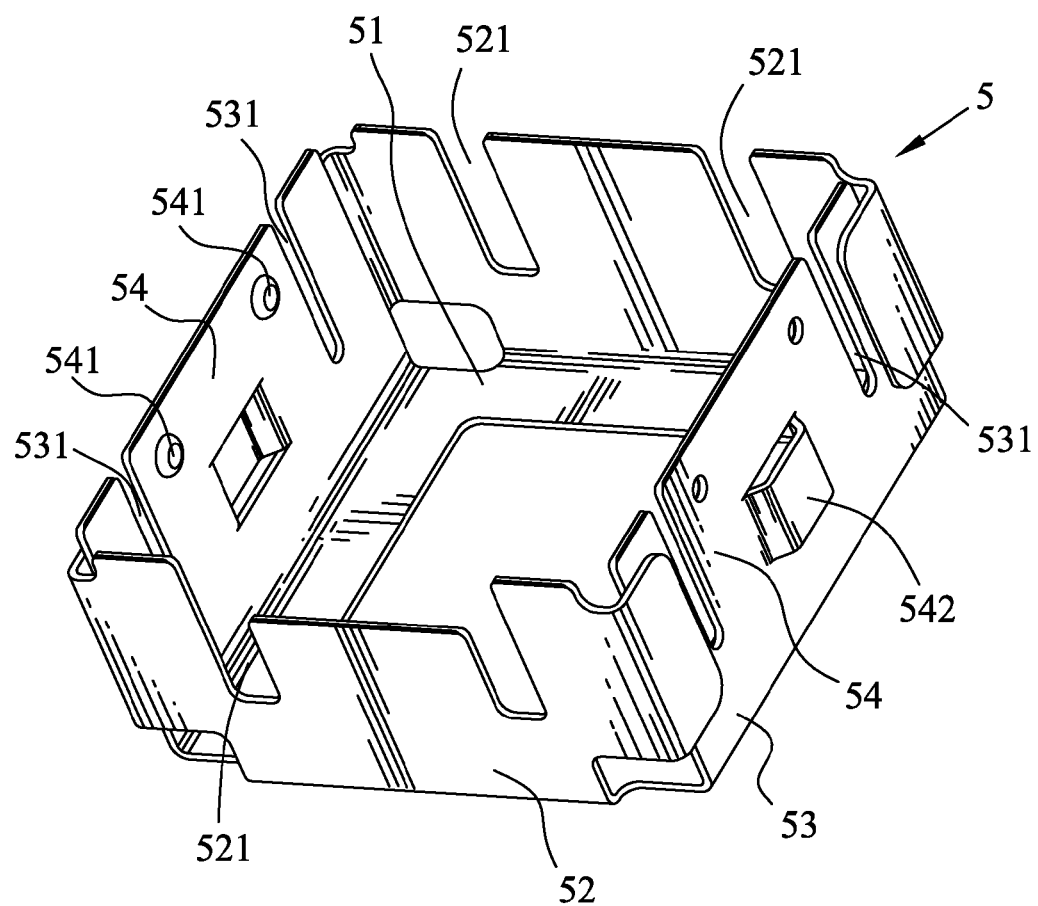
FIG. 3 is a perspective view of a second shield of the module connector shown in FIG. 2 seen from another angle.

With reference to FIGS. 1-3, the second shield 5, which is made of metal material as a whole and covers the socket 1, has a rectangular frame 51, a pair of opposite first containing plates 52 extended downwards from two opposite outer edges of the frame 51, and a pair of opposite second containing plates 53 extended downwards from another two opposite outer edges of the frame 51. The frame 51 has an opening for exposing the lens module 200. The first containing plates 52 are connected with the second containing plates 53 by means of two opposite sides of each first containing plate 52 bent to buckle with the respective second containing plates 53. Each of the first containing plates 52 has two parallel receiving slots 521, spaced away from each other with a predetermined distance. The receiving slot 521 extends upwards and downwards and passes through a bottom of the first containing plate 52, receiving the corresponding holding slices 412 for preventing interference, when the holding slices 412 are pressed by the inserted lens module 200 to move outwards. Each of the second containing plates 53 is formed with two abreast slits 531, which extend upwards and downwards and pass through a bottom of the second containing plate 53, forming a free slice 54 therebetween. The free slice 54 is punched inwards to form two protrusions 541 at a lower portion thereof, corresponding to the locking openings 44, and outwards to form a protruding ear 542 at an upper portion thereof. The protruding ear 542 is used for engaging with a jig (not shown) in disassembly for removing the second shield 5 from the socket 1 conveniently.

Figure 4:
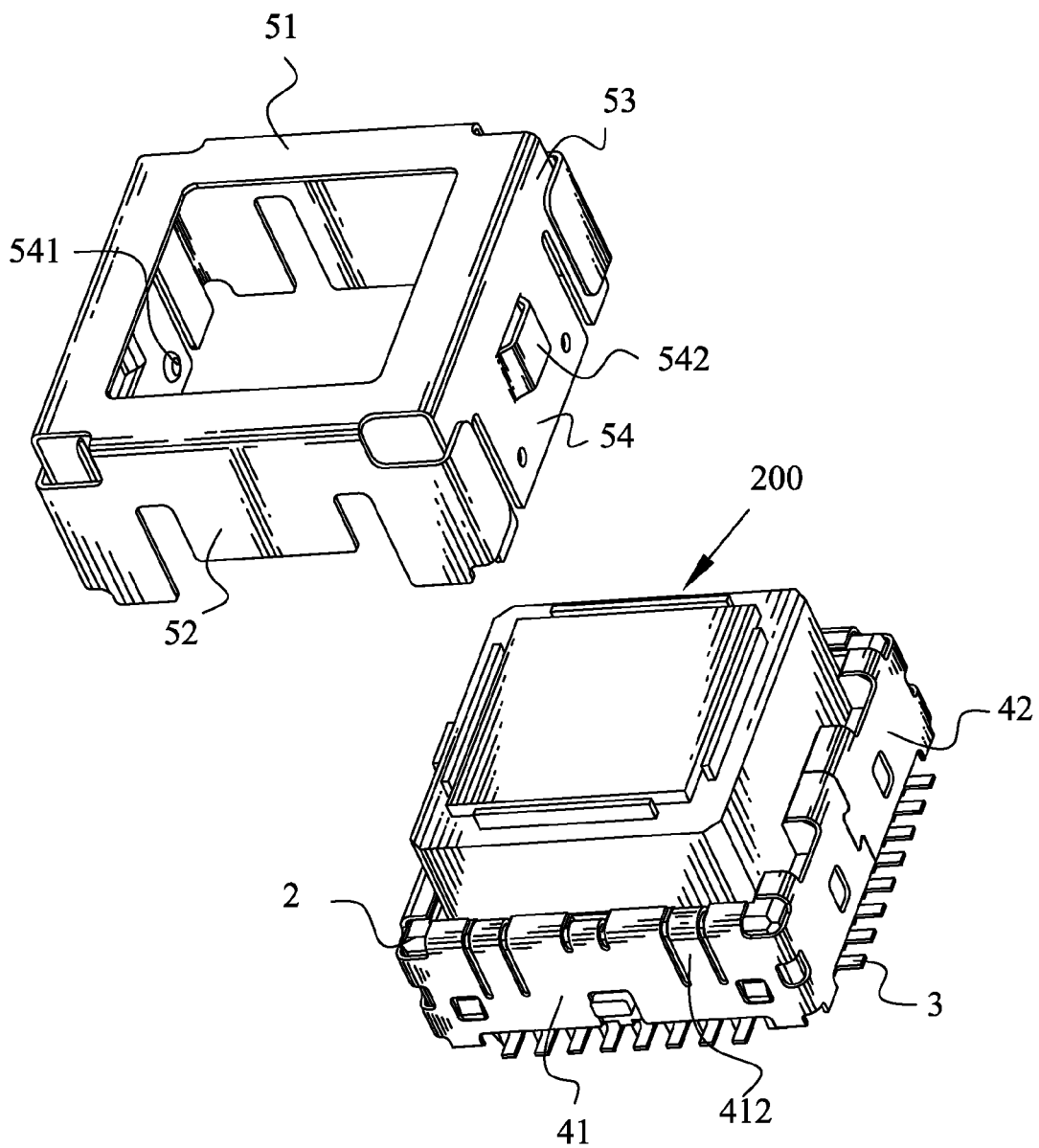
FIG. 4 is a perspective view of the module connector shown in FIG. 1, wherein a lens module is inserted into a socket and the second shield is separated from the socket.

Please refer to FIGS. 1-2 and FIG. 4, in assembly, the contacts 3 are received in the contact grooves 25 of the insulating housing 2. The first shield 4 is coupled with the insulating housing 2, with the fixing openings 43 buckled with the fixing lumps 223. The buckling slices 411 are buckled in the buckling trough 221 for fixing the first shield 4 to the insulating housing 2. The holding slices 412 are located in the holding recesses 412, with free ends thereof projecting into the receiving chamber 24 for resting against an outer periphery of the lens module 200 which is received in the receiving chamber 24. Herein, the lens module 200 is a rectangular block shape and has a height higher than that of the first sidewalls 22 and the second sidewalls 23. The second shield 5 is covered to the socket 1 where the lens module 200 is inserted into the receiving chamber 24. The protrusions 541 rests against the second lateral plates 42 of the first shield 4 so that the free slices 54 resiliently deflect outwards. The free slices 54 return automatically until the protrusions 541 slide into the locking openings 44, thereby fixing the second shield 5 to the socket 1. The frame 51 covers on a top surface of the lens module 200 for stopping the lens module 200 from departing from the socket 1.

As described above, the module connector 100 provides the simple second shield 5 for fixing the lens module 200 in the socket 1. The free slice 54 separated from the second containing plate 53 by the two slits 531, can deflects outwards resiliently with respect to the second containing plate 53 in assembling process, consequently, the protrusions 541 slide into the locking openings 44 smoothly, without scraping against the second lateral plate 42 and deforming the second lateral plate 42. Therefore, the structure of the second shield 5 is capable of fixing the lens module 200 in the socket 1, meanwhile, facilitates the assembly and guarantees the quality of the module connector 100.

The foregoing description of the present invention has been presented for the purposes of illustration and description. It is not intended to be exhaustive or to limit the invention to the precise form disclosed, and obviously many modifications and variations are possible in light of the above teaching. Such modifications and variations that may be apparent to those skilled in the art are intended to be included within the scope of this invention as defined by the accompanying claims.

What is claimed is:

1. A module connector for receiving a lens module, comprising:
   a socket comprising:
      an insulating housing having a rectangular base and four sidewalls extended upwards from four edges of the base, forming a receiving chamber for receiving the lens module;
      a plurality of contacts received in the insulating housing and extended into the receiving chamber for electrically connected with the lens module;
      a first shield coupled with the insulating housing and having four lateral plates, the lateral plates connected with one another and enclosing outer peripheries of the sidewalls, at least one lateral plate having a plurality of locking openings; and
   a second shield covered to the socket having a rectangular frame, and four containing plates extended downwards from outer edges of the frame, at least one containing plate having two parallel slits extending upwards and downwards and passing through a bottom edge thereof, forming a free slice therebetween, a plurality of protrusions disposed at an inner surface of the free slice, corresponding to the locking openings;
   wherein the frame covers a top of the lens module received in the receiving chamber, the free slice deflects outwards resiliently when the protrusions slide on the lateral plate and returns automatically until the protrusions slide into the locking openings, thereby fixing the second shield to the socket.

2. The module connector as claimed in claim 1, wherein the containing plates have a pair of opposite first containing plates and a pair of opposite second containing plates, the free slices are formed at the second containing plates.

3. The module connector as claimed in claim 2, wherein each free slice is protruded outwards to form a protruding ear for facilitating to disassemble the second shield from the socket.

4. The module connector as claimed in claim 2, wherein the lateral plates are defined as a pair of opposite first lateral plates and a pair of opposite second lateral plates, the locking openings are formed at the second lateral plates.

5. The module connector as claimed in claim 4, wherein a top edge of each first lateral plate is bent inwards to form two holding slices projecting into the receiving chamber for holding the inserted lens module, each of the first containing plates has two receiving slots for receiving the holding slices when the holding slices are extruded by the inserted lens module to move outwards.

* * * * *